United States Patent
Zhang et al.

(10) Patent No.: US 12,388,230 B2
(45) Date of Patent: Aug. 12, 2025

(54) MONOLITHIC PHOTONIC RESONATOR AND ASSOCIATED LASER FREQUENCY STABILIZATION METHOD

(71) Applicants: THE REGENTS OF THE UNIVERSITY OF COLORADO, Denver, CO (US); Government of the United States of America as represented by the Secretary of Commerce, Gaithersburg, MD (US)

(72) Inventors: Wei Zhang, Boulder, CO (US); Liron Stern, Boulder, CO (US); Scott B. Papp, Boulder, CO (US)

(73) Assignees: THE REGENTS OF THE UNIVERSITY OF COLORADO, A BODY CORPORATE, Denver, CO (US); Government of the United States of America as represented by the Secretary of Commerce, Gaithersburg, MD (US)

(*) Notice: Subject to any disclaimer, the term of this patent is extended or adjusted under 35 U.S.C. 154(b) by 737 days.

(21) Appl. No.: 17/331,424

(22) Filed: May 26, 2021

(65) Prior Publication Data
US 2021/0376555 A1     Dec. 2, 2021

Related U.S. Application Data

(60) Provisional application No. 63/030,039, filed on May 26, 2020.

(51) Int. Cl.
| | |
|---|---|
| *H01S 3/13* | (2006.01) |
| *H01S 3/04* | (2006.01) |
| *H01S 3/06* | (2006.01) |

(52) U.S. Cl.
CPC .............. *H01S 3/13* (2013.01); *H01S 3/0407* (2013.01); *H01S 3/061* (2013.01); *H01S 3/1305* (2013.01)

(58) Field of Classification Search
USPC .......................................... 428/131–140, 428
See application file for complete search history.

(56) References Cited

U.S. PATENT DOCUMENTS

| | | | |
|---|---|---|---|
| 2010/0182710 A1* | 7/2010 | Dinger | C23C 28/023 205/71 |
| 2019/0199051 A1* | 6/2019 | Herr | H01S 3/0621 |

OTHER PUBLICATIONS

Hafner, et al., 8×10-17 Fractional Laser Frequency Instability with a Long Room-Temperature Cavity, dated Apr. 1, 2015, arXiv:1502.02608v2 [physics.optics] Mar. 31, 2015, 5 pages.

(Continued)

*Primary Examiner* — Stephone B Allen
*Assistant Examiner* — Tamara Y. Washington
(74) *Attorney, Agent, or Firm* — Cozen O'Connor

(57) ABSTRACT

A monolithic photonic resonator includes a bulk optic with first and second superpolished facets, and a high-reflectivity coating applied to each of the first and second superpolished facets. The superpolished facets form an optical resonator. The bulk optic is a single piece of an optical material that is solid, i.e., has no internal holes, gaps, or pockets. The bulk optic therefore serves as an intraresonator optical medium while still supporting a finesse of 10,000 or more. The superpolished facets may be counterfacing to form a Fabry-Perot cavity. Alternatively, the bulk optic may include forms one or more additional facets off of which light inside the bulk optic undergoes total internal reflection. The monolithic photonic resonator may be mounted in a support structure that minimizes the overall vibration sensitivity of the resonator's resonance frequency.

16 Claims, 9 Drawing Sheets

(56) References Cited

OTHER PUBLICATIONS

Lee, et al., Ultra-High-Q Wedge-Resonator on a Silicon Chip, dated Dec. 12, 2011, arXiv.1112.2196v1 [physics.optics] Dec. 9, 2011, 5 pages.
Liang et al., Utralow Noise Miniature External Cavity Semiconductor Laser, Nature Communications, published Jun. 24, 2015, pp. 1-6.
Stern, et al., Compact Narrow-Linewidth Integrated Laser based on a Low-Loss Silicon Nitride Ring Resonator, Optics Letters, vol. 42, No. 21, dated Nov. 1, 2017, pp. 4541-4544.
Lim et al., Chasing the Thermodynamical Noise Limit in Whispering-Gallery-Mode Resonators for Ultrastable Laser Frequency Stabilization, Nature Communications, 8:8, pp. 1-7.
Zhang, et al., A Microrod Optical-Frequency Reference in the Ambient Environment, dated Nov. 10, 2021, arXiv.1903.01255v1 [physics.ins-det] Feb. 28, 2019, 5 pages.
Davila-Rodriguez et al., A Compact, Thermal Noise Limited Reference Cavity for Ultra-Low Noise Microwave Generation, dated Jan. 13, 2017, arXiv:1701.03157v1 [physics.ins-det] Jan. 6, 2017, 9 pages.

* cited by examiner

MONOLITHIC PHOTONIC RESONATOR AND ASSOCIATED LASER FREQUENCY STABILIZATION METHOD

RELATED APPLICATIONS

This application claims priority to U.S. Provisional Patent Application No. 63/030,039, titled "Bulk Photonic Resonator for Laser Frequency Stabilization" and filed May 26, 2020, which is incorporated herein by reference in its entirety.

STATEMENT REGARDING FEDERALLY SPONSORED RESEARCH OR DEVELOPMENT

This invention was made with government support under grant number 70NANB18H006 awarded by NIST. The government has certain rights in the invention.

BACKGROUND

Stable lasers that provide high-spectral purity are key components for a variety of applications, such as timekeeping (e.g., optical atomic clocks), gravitational-wave detection, photonic-microwave synthesis, and communications. Advances in these application areas rely on laser phase-noise properties, which correspond to the spectral linewidth in the frequency domain. To achieve a narrow integrated linewidth, a state-of-the-art stable laser system usually disciplines a laser to a high-finesse Fabry-Perot cavity. Linewidths well below 1 Hz have been demonstrated.

SUMMARY

To achieve a laser linewidth below 1 Hz, a stable laser system typically requires isolation from ambient fluctuations (e.g., temperature, pressure, and vibration). Consequently, a stable laser system typically has a relatively large size, weight, and power consumption, as compared to lasers with larger linewidths, and is relatively complex to implement as it requires vacuum operation, vibration isolation, and multiple layers of thermal isolation. Several applications could benefit from portability of a stable laser system, in which case robustness and integration are primary considerations. However, it can still be a challenge to use these systems out of the laboratory environment due to their complexity.

A state-of-the-art stable laser system usually reduces the linewidth of a free-running laser by locking the laser to a resonance of a high-finesse Fabry-Perot cavity. To achieve the narrowest laser linewidth, the Fabry-Perot cavity is typically constructed to have the narrowest resonance linewidths (i.e., highest Q). These resonance linewidths can be reduced by increasing the finesse of the cavity (i.e., reducing loss), increasing the length of the cavity, or both. Most prior-art Fabry-Perot cavities used for laser-linewidth narrowing are typically formed from a cylindrical shell that is hollow in the region between two high-reflectivity mirrors. With this configuration, the intraresonator optical medium between the mirrors can be evacuated, such that the intracavity light propagates through vacuum. Compared to other intraresonator mediums, a vacuum has negligible absorption and loss due to scattering.

The present embodiments feature a high-finesse monolithic photonic resonator that has high-reflectivity coatings deposited onto superpolished facets of a bulk optic. The bulk optic is a single piece of an intraresonator optical medium that is solid, i.e., has no internal holes, gaps, or pockets. One aspect of the present embodiments is the realization that a solid bulk material can be used as the intraresonator optical medium while still supporting a finesse of 10,000 or more. While some prior-art optical resonators can achieve a finesse of several hundred thousand, a finesse of 10,000 is still sufficient to significantly narrow the laser linewidth (e.g., reduce the full-width at half maximum linewidth of the laser by two orders of magnitude, or more). Accordingly, the present embodiments differ from prior-art high-finesse Fabry-Perot cavities in that intracavity light does not propagate through a vacuum.

One advantage of the present embodiments is that the monolithic photonic resonator is significantly more robust to external vibrations and accelerations than the prior-art Fabry-Perot cavities mentioned above. Such vibrations introduce temporal changes to the cavity length, which "smears out" the resonance linewidth, effectively increasing the laser linewidth. To reduce this effect in prior-art Fabry-Perot cavities, high-reflectivity mirrors are sometimes bonded (e.g., contact bonded) to a common spacer (e.g., fabricated from ultralow-expansion glass). However, this configuration does not necessarily improve rigidity to the level attainable with the monolithic design of the present embodiments. Typically, these prior-art Fabry-Perot cavities require special mounting and orientation to achieve low vibration sensitivities.

Another advantage of the present embodiments is that the monolithic photonic resonator can achieve narrow resonance linewidths without having to increase cavity length. As a result, the present embodiments occupy a much smaller volume that prior-art Fabry-Perot cavities, further helping to increase rigidity. The smaller volume also improves temperature stabilization, and therefore also reduces the size and power requirements for cryogenic cooling.

Another advantage of the present embodiments is that the monolithic photonic resonator is simpler to construct than prior-art high-finesse Fabry-Perot cavities that are shaped as a cylindrical shell. Specifically, no spacer is needed, advantageously saving the time and resources needed to polish the end faces of the spacer and bond the spacer to the mirrors. Furthermore, mirrors used for prior-art high-finesse Fabry-Perot cavities are typically polished on both sides, with a high-reflectivity coating applied to one side and an anti-reflection coating applied to the other. Thus, a Fabry-Perot with two mirrors requires four polished surfaces and four coatings (two high-reflectivity and two anti-reflection). By contrast, the monolithic photonic resonator of the present embodiments requires only two superpolished facets, each with a high-reflectivity coating, thereby eliminating polishing steps and the need for anti-reflection coatings.

In embodiments, a monolithic photonic resonator includes a bulk optic with first and second superpolished facets, and a high-reflectivity coating applied to each of the first and second superpolished facets. The first and second superpolished facets form an optical resonator. In some of these embodiments, the first and second superpolished facets are counterfacing, in which case the optical resonator is a Fabry-Perot cavity. In other embodiments, the bulk optic forms one or more additional facets off of which light inside the bulk optic undergoes total internal reflection. In this case, the first and second superpolished facets cooperate with the one or more additional facets to define a mode structure of the optical resonator.

DETAILED DESCRIPTION

Figure 1:
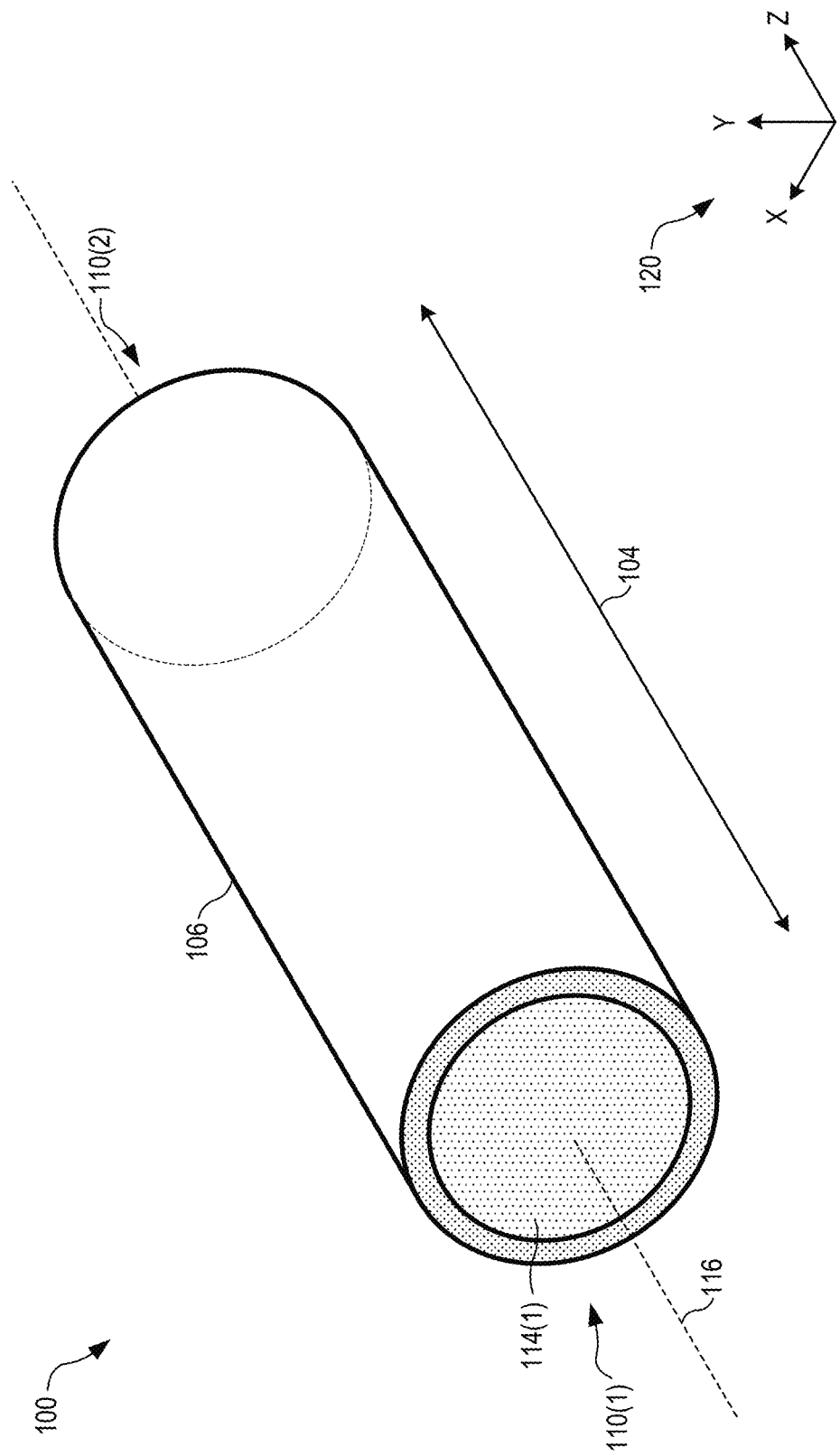
FIG. 1 is a perspective view of a high-finesse monolithic photonic resonator, in an embodiment.

FIG. 1 is a perspective view of a high-finesse monolithic photonic resonator 100 for laser frequency stabilization and linewidth narrowing. The monolithic photonic resonator 100 is formed from a bulk optic 106 (i.e., a single piece of an optical material) having a first superpolished facet 110(1) and a second superpolished facet 110(2). The superpolished facets 110(1) and 110(2) are counterfacing, thereby forming an optical resonator. In the example of FIG. 1, the bulk optic 106 is shaped as a cylinder, wherein each of the superpolished facets 110(1) and 110(2) forms a circular end face. However, the bulk optic 106 may have a different shape (e.g., square or rectangular cuboid) without departing from the scope hereof. A length 104 of the bulk optic 106 along the z direction (see the right-handed coordinate system 120) may be between 5 and 100 mm (inclusive). However, the length 104 may be less than 5 mm or greater than 100 mm without departing from the scope hereof.

Deposited on each of the superpolished facets 110(1) and 110(2) is a high-reflectivity optical coating 114 that increases the finesse of the optical resonator. For clarity in FIG. 1, only a first optical coating 114(1) on the first superpolished facet 110(1) is shown. Each optical coating 114(1), 114(2) may be an ion-beam sputtered dielectric stack consisting of an alternating sequence of $SiO_2$ and $Ta_2O_5$ layers. The thickness of each layer may be selected to maximize the reflectivities of the superpolished facets 110(1) and 110(2) at, or near, a wavelength of a laser to be locked (i.e., frequency stabilized) to the monolithic photonic resonator 100. Other materials (e.g., metal) may be used for each of the optical coating 114(1) and 114(2) without departing from the scope hereof.

The monolithic photonic resonator 100 has an optical axis 116 that is oriented longitudinally (i.e., parallel to the z axis) and that passes through the center of each of the superpolished facets 110(1) and 110(2). FIG. 1 shows the superpolished facets 110(1) and 110(2) as planar, in which case the optical resonator is a Fabry-Perot resonator. However, one or both of the superpolished facets 110(1) and 110(2) may be convex such that the optical resonator is stable.

To lock a laser to the monolithic photonic resonator 100, a laser beam sampled from the output of the laser is steered into the monolithic photonic resonator 100 along the optical axis 116 to excite a mode of the optical resonator. The laser beam propagates through the bulk optic 106 between the facets 110(1) and 110(2). The bulk optic 106 is fabricated from a solid intraresonator optical medium. Light absorption by the bulk optic 106 is a loss mechanism that decreases the Q of the monolithic photonic resonator 100, or equivalently increases the linewidth of its resonances. Accordingly, it is common to select an intraresonator optical medium with low absorption at the laser wavelength.

As described in more detail below, a prototype of the monolithic photonic resonator 100 was constructed using fused silica for the bulk optic 106, and with low-loss high-reflectivity coatings (R=0.99998) for the optical coatings 114(1) and 114(2). To further minimize loss due to scatter, the facets 110(1) and 110(2) were superpolished prior to deposition of the optical coatings 110(1) and 110(2). Scattering and loss due to the fused silica itself was measured to be 130 parts-per-million (ppm). The length 104 of the prototype was 2.5 cm, and a finesse of 20,000 at a wavelength of 1560 nm was achieved. The inventors have used higher-purity samples of fused silica in a similar configuration to achieve a finesse of 100,000. Fused silica was selected as the intraresonator optical medium because of its low absorption at 1560 nm. However, a different material may be used for the intraresonator optical medium, such as for stabilizing a laser at a wavelength where the different material also has low absorption. Examples of such materials include sapphire, silicon, calcium fluoride, magnesium fluoride, terbium-doped calcium fluoride, terbium-doped fused silica, glass, and quartz.

Due to the difference in refractive indices between the intraresonator optical medium and the surrounding medium (e.g., air), the monolithic photonic resonator 100 also helps "guide" light propagating through the intraresonator optical medium. Equivalently, the bulk optic 106 helps to transversely confine light within the optical resonator due to the reflections of the light off of the interface between the intraresonator and surrounding optical mediums.

A transverse size (i.e., in the x and y directions) of the bulk optic 106 may be selected to be larger than the waist of the inputted laser beam, or spot size, at the superpolished facets 110(1) and 110(2), of the excited mode. This choice of transverse size minimizes diffraction losses, thereby preventing degradation of the optical resonator's finesse. For example, if the spot size at the first and second superpolished facets 110(1), 110(2) is 0.5 mm, a diameter of the bulk optic 106 may be selected to be 10 mm. However, a different diameter of the bulk optic 106 may be selected without departing from the scope hereof.

Figure 2:
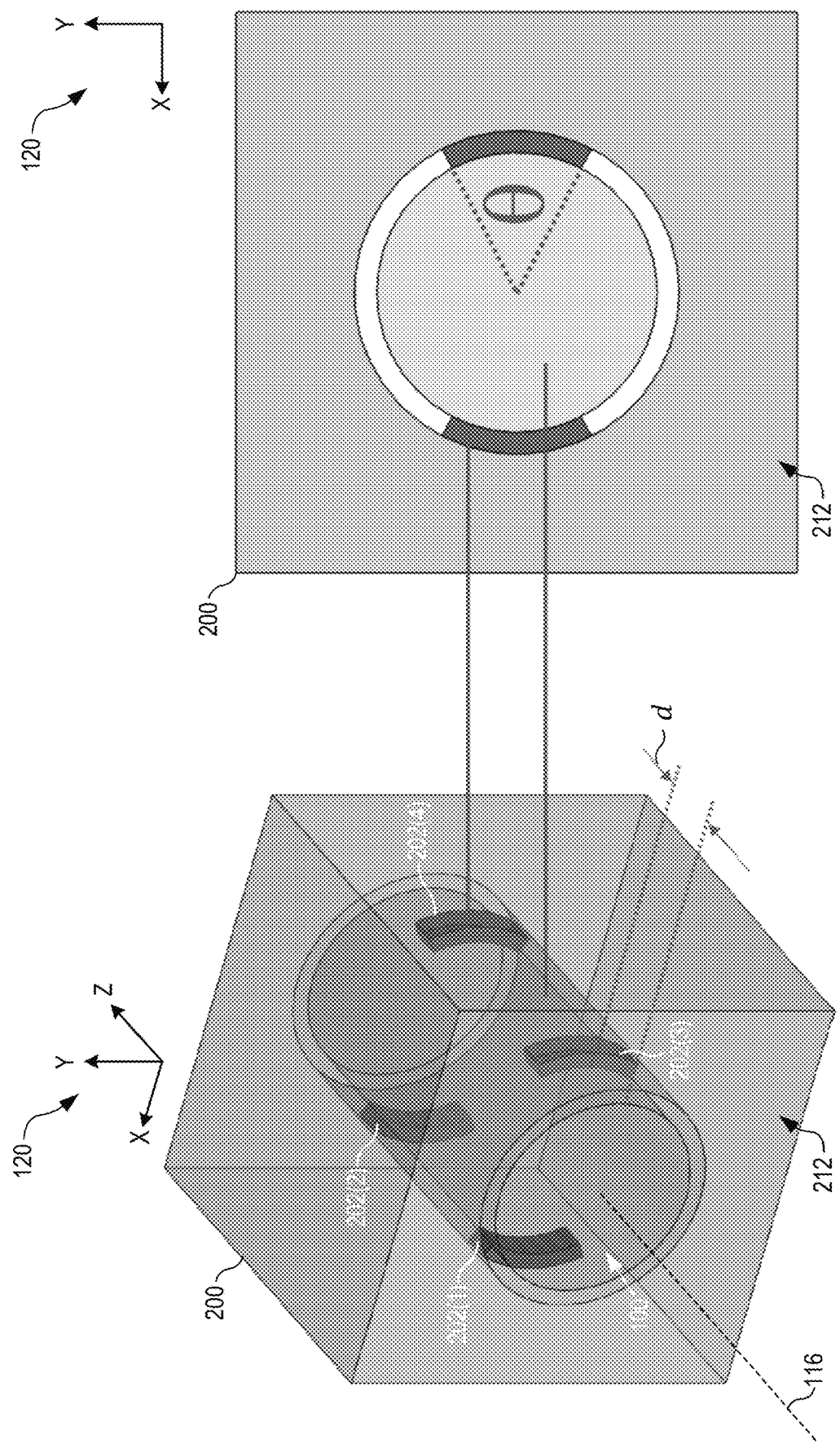
FIG. 2 shows a perspective view and a front view of the monolithic photonic resonator of FIG. 1 mounted in a support structure, in an embodiment.

FIG. 2 shows a perspective view and a front view of the monolithic photonic resonator 100 mounted in a support structure 200. The support structure 200 forms a hole into which the monolithic photonic resonator 100 is inserted. In the example of FIG. 2, the support structure 200 forms a cylindrical through-hole with a diameter slightly larger than the diameter of the cylindrical monolithic photonic resonator 100, such that the cylindrical monolithic photonic resonator 100 may be inserted thereto. The support structure 200 may be made of polytetrafluorethylene (PTFE), thermoplastic, polymer, or another material.

The support structure 200 physically couples to the monolithic photonic resonator 100 via support teeth 202. In the example of FIG. 2, first and second support teeth 202(1), 202(2) are located on a first side (in the x direction) of the monolithic photonic resonator 100, while third and fourth support teeth 202(3), 202(4) are located on a second side, opposite the first side, of the monolithic photonic resonator 100. Relative to the optical axis 116, each of the support teeth 202 subtends an angle θ (e.g., 55°). In some embodiments, one or more of the support teeth 202 subtend an angle θ of 360°, thereby fully encircling the monolithic photonic resonator 100.

Each of the first and third support teeth 202(1), 202(3) is located a distance d (in the z direction) from a front face 212 of the support structure 200. Although not shown in FIG. 2, each of the second and fourth support teeth 202(2), 202(4) may also be located the distance d from a corresponding rear face of the support structure 200. Thus, when a length of the support structure 200 in the z direction equals the length 104 of the monolithic photonic resonator 100, and the monolithic photonic resonator 100 is fully inserted into the support structure 200 (i.e., the first superpolished facet 110(1) lies flush with the front face 212), then each of the first and third support teeth 202(1), 202(3) is located the distance d from the first superpolished facet 114(1). Similar arguments hold for the distance d from each of the second and fourth support teeth 202(1), 202(4) to the second superpolished facet 110 (2).

The overall vibration sensitivity of the optical resonator's resonance frequency can be optimized by selecting one or both of the distance d and the angle θ. While the example of FIG. 2 shows the support structure 200 with four support teeth 202(1)-202(4), the support structure 200 may contain more or fewer support teeth 202 (e.g., three support teeth 202 on each of the first and second sides). The support teeth 202 may be located at difference distances from the nearest face of the support structure 200. Thus, it is not required that all of the support teeth 202 be located the same distance d from their corresponding facets. Similarly, the support teeth 202 do not need to all subtend the same angle θ.

Since the support teeth 202 may be fabricated from a material with a refractive index similar to the intraresonator optical medium, light within the bulk optic may not undergo total internal reflection when it strikes an internal surface of the bulk optic that is physically coupled with one of the support teeth 202. In this case, some of the light may refract out of the bulk optic 106, leading to loss. Accordingly, a width of each of the support teeth 202 (in the z direction) may be made small to minimize this loss. Similarly, each of the support teeth 202 may be sized to ensure that the bulk optic 106 nowhere comes into direct contact with the rest of the support structure 200.

Figure 3:
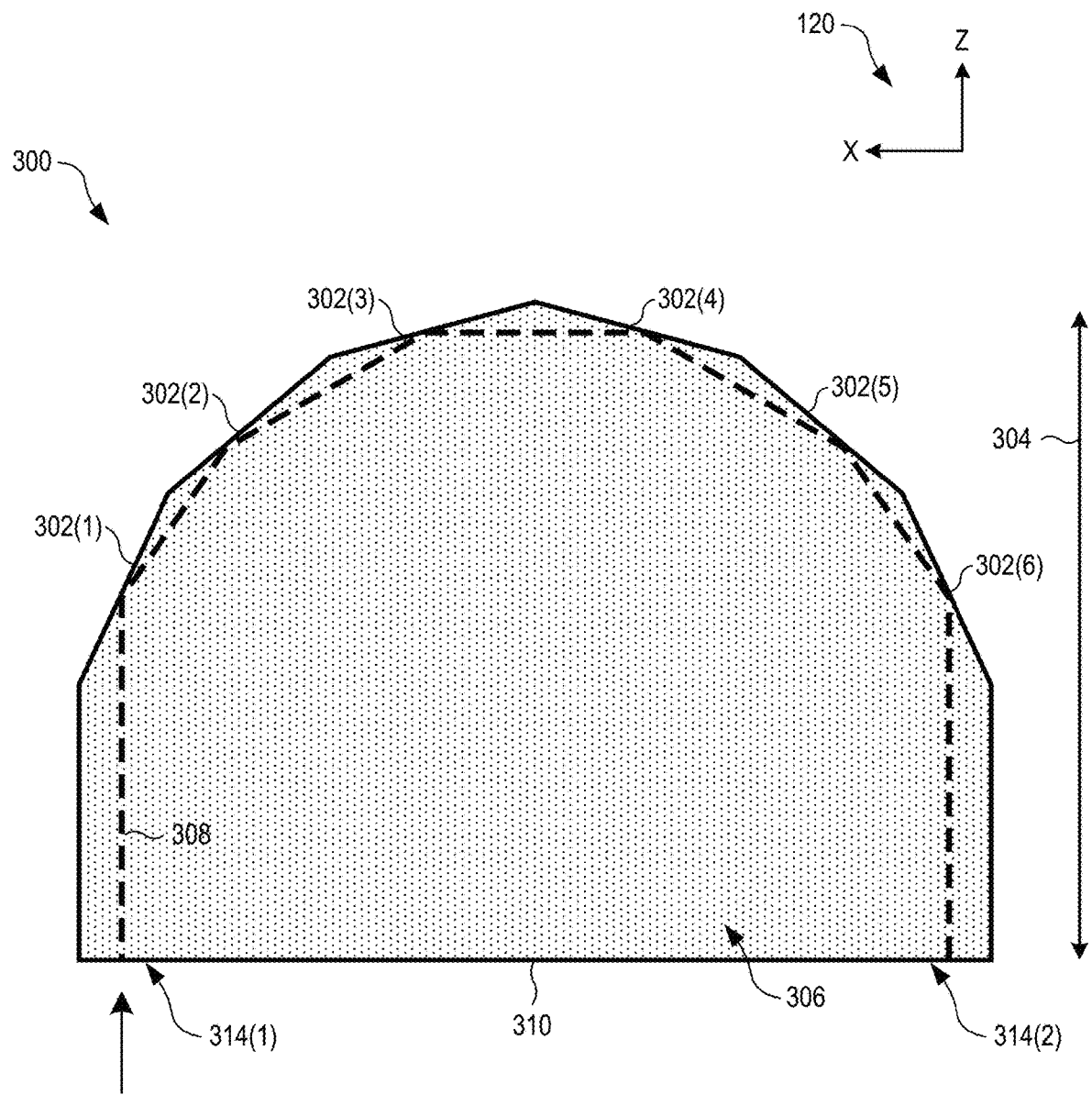
FIG. 3 is a top view of a monolithic photonic resonator that is similar to the monolithic photonic resonator of FIGS. 1 and 2 except that it configured with additional facets, in an embodiment.

FIG. 3 is a top view of a monolithic photonic resonator 300 that is similar to the monolithic photonic resonator 100 of FIGS. 1 and 2 except that it configured with additional facets 302 off of which light 308 propagating within a bulk optic 306 can undergo total internal reflection. Advantageously, a single high-reflectivity optical coating (e.g., a multi-layer dielectric stack) can be applied to one superpolished input facet 310 to generate both first and second high-reflectivity surfaces 314(1), 314(2) needed to form the optical resonator. This saves time fabricating the monolithic photonic resonator 300 by eliminating the need for a second superpolishing step and a second optical-coating process run. Thus, the high-reflectivity surfaces 314(1) and 314(2) cooperate with the additional facets 302 to define the mode structure of light 308 within the bulk optic 306. The one superpolished input face 310 may be planar, as shown in FIG. 3.

Another benefit of the monolithic photonic resonator 300 is that the optical resonator has an optical path length (i.e., the optical path length between the first and second high-reflectivity surfaces 314(1), 314(2)) that is longer than the physical dimensions of the bulk optic 306. Since the linewidth of an optical resonator's resonances decreases linearly with optical path length, the monolithic photonic resonator 300 may have narrower resonances than the monolithic photonic resonator 100, assuming the length 104 of the resonator 100 is similar to a length 304 of the resonator 300. Thus, with total internal reflection, the monolithic photonic resonator 300 can be designed with various geometries that extend optical path length while maintaining a small physical volume or area. Some of these geometries may advantageously decrease vibration sensitivity.

While FIG. 3 shows the monolithic photonic resonator 300 with six additional facets 302, the monolithic photonic resonator 300 may have more or fewer additional facets 302. In addition, the monolithic photonic resonator 300 may have a non-planar mode structure in which one or more of the additional facets 302 are angled to reflect the light 308 along the vertical y direction. Thus, while the monolithic photonic resonator 100 has a longitudinal mode structure that is linear (i.e., the longitudinal modes extend along a single linear dimension between the superpolished facets 110(1) and 110(2)), the monolithic photonic resonator 300 may have a longitudinal mode structure that is two-dimensional (e.g., the longitudinal modes extend along two dimensions between the high-reflectivity surfaces 314(1) and 314(2), as shown in FIG. 3) or a longitudinal mode structure that is three-dimensional.

While FIG. 3 shows the monolithic photonic resonator 300 with the high-reflectivity surfaces 314(1) and 314(2) on the same superpolished facet 310, the monolithic photonic resonator 300 may be configured such that the high-reflectivity surfaces 314(1) and 314(2) are on different superpolished facets, wherein a high-reflectivity optical coating (e.g., see the optical coatings 114(1) and 114(2) of FIG. 1) is applied to each of said different superpolished facets. These different superpolished facets may be co-planar, thereby eliminating the need for a second optical-coating process. However, the different superpolished facets may be non-coplanar (e.g., perpendicular to each other, parallel to each other and perpendicularly offset, etc.) without departing from the scope hereof.

In embodiments, either of the monolithic photonic resonators 100 and 300 may be cryogenically cooled to further reduce absorption, and therefore further enhance Q (i.e., narrow the resonator's resonances). Prior-art cryogenic optical resonators used for laser stabilization and linewidth narrowing typically use a crystalline silicon or sapphire spacer to which a pair of high-reflectivity mirrors is bonded. Each of the monolithic photonic resonators 100 and 300 can be used to obtain similar resonance linewidths as these silicon-based cryogenic optical resonators, but with a length 104 that is at least ten times smaller. Advantageously, the smaller volume of the monolithic photonic resonator 100/300 reduces the cooling requirements needed for a cryostat. Furthermore, the smaller volume makes it easier to thermally shield the monolithic photonic resonator 100/300 within the cryostat, in turn improving thermal stability.

Experimental Demonstration

In this section, we describe a photonic-atomic laser that combines the monolithic photonic resonator 100 of FIG. 1 with a microfabricated rubidium (Rb) vapor cell. The laser attains high coherence by stabilization to both the cavity resonance and the atomic resonance, hence hybridizing the photonic and atomic properties. The cavity is based on a bulk, fused-silica cylinder, and we apply superpolishing and low-loss reflection coatings on both facets to realize a finesse of ≈20,000. The absence of an evacuated center bore, which is essential in traditional cavity systems, simplifies our system by eliminating the need for vacuum. Vibration-immune design is mandatory to reduce vibration-induced frequency fluctuations. We achieve this goal by a novel design of the cavity holding structure for a net vibration sensitivity of ≈$10^{-10}$/g, where g is earth's gravity. With these features we achieve a cavity-stabilized laser linewidth of 25 Hz in an ambient environment, which is dominated by thermorefractive noise of the cavity mode volume. The cavity resonance is also susceptible to temperature-induced frequency drift. The unvarying atomic transitions of Rb atoms with 6 MHz radiative lifetime cannot provide the same level of frequency discrimination as our cavity, yet Rb is an ideal system to correct medium and long timescale cavity drift. Therefore, we stabilize the cavity resonance, using all-optical thermal feedback derived from saturated-absorption Rb spectroscopy. Operating both system sections can require performance tradeoffs; the photonic-atomic laser linewidth is 200 Hz but the Allan deviation is 7×$10^{-13}$ at an averaging period of 300 s. Due to the compact size of the bulk cavity and the micro-machined Rb atomic cell, our photonic-atomic laser offers a stable, accurate, and narrow linewidth source.

Overview of Components and Concept

FIG. 4 presents an overview of the photonic and atomic components and the main results of our experiments. FIG. 4A is a photograph of the fused-silica cavity alongside the micro-machined Rb atomic cell. In experiments, we installed these two components in aluminum enclosures. We operated the photonic-atomic laser by stabilizing a laser to the cavity, and referencing the cavity resonance with respect to a 780-nm atomic transition of Rb.

Figure 4A:
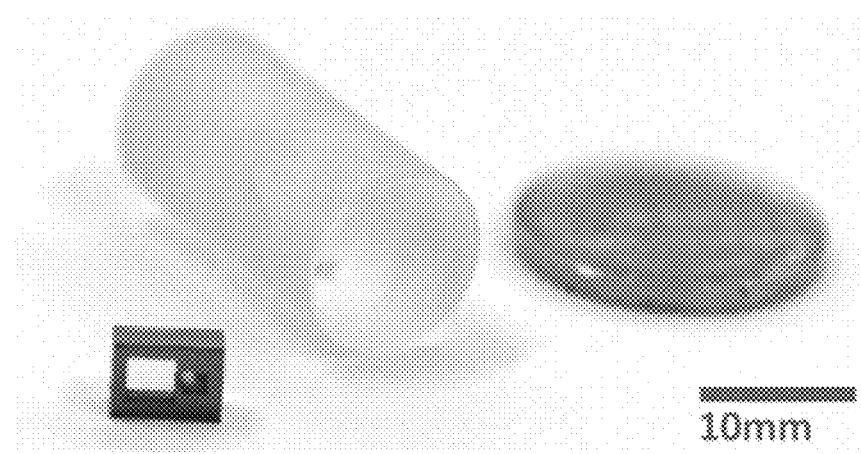
FIG. 4A is a photograph of a fused-silica photonic cavity and a micromachined atomic vapor cell that are combined to form a photonic-atomic laser.
Figure 4B:
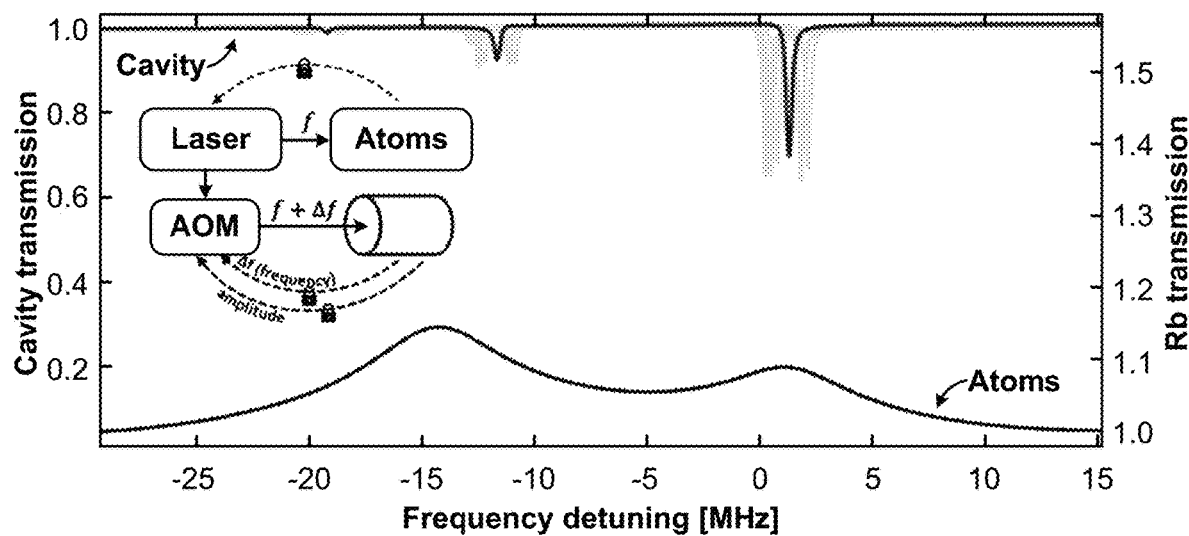
FIG. 4B shows spectroscopy of the photonic cavity of FIG. 4A and the Doppler-free hyperfine transition of rubidium. The frequency traces have been superimposed, using the atomic traces as an absolute reference, and they illustrate the thermo-optic frequency wander (gray traces) of the photonic-cavity and the difference in linewidth. The horizontal axis is referred to a wavelength of 1560 nm.
Figure 4C:
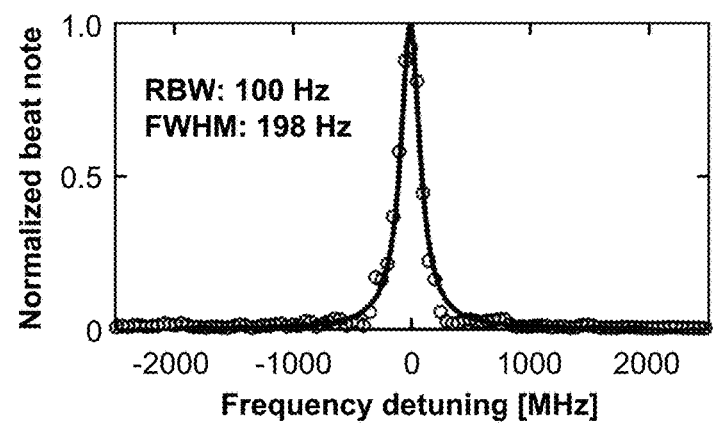
FIG. 4C shows the instantaneous lineshape of the photonic-atomic laser.

FIG. 4B shows the spectroscopic response of the cavity and atomic cell versus optical frequency. The ion beam sputtered cavity coating reflectivity is designed and measured to be 0.99998. The scattering and loss due to the silica material is measured to be 130 part-per-million (ppm), and the cavity offers a linewidth of 200 kHz, a finesse of 20,000, and a Q of approximately 1 billion. Here we show the resonance modes in the reflection spectrum of the cavity. Due to the birefringence of the cavity, there are two polarization states for cavity fundamental modes, however they are well-resolved with a splitting of ≈12 MHz which is much larger than the cavity linewidth. We also show saturation spectroscopy of the Rb cell, corresponding to the $^{85}$Rb F=2 to F'=½ hyperfine transitions. To understand and portray the long-term evolution of the cavity and atomic Rb resonances, we acquire these traces many times over the course of a few hours using the atomic traces as an absolute reference. Hence, frequency drift appears to smear-out the sharp cavity resonances as shown by the gray traces while the relatively broad Rb atomic resonances with 6 MHz natural linewidth maintain a constant absolute optical frequency. Leveraging the advantages of these sub-systems is the central concept of our work, which enables a stable, ultranarrow-linewidth photonic-atomic laser.

We run the photonic-atomic laser by the procedure in the inset of FIG. 4B. First, we lock a free-running semiconductor laser to the atomic resonance signal by direct feedback to laser frequency. Therefore a long-term average of the laser frequency yields the atomic-resonance frequency. Second, for convenience, we use an acousto-optic modulator (AOM) as an actuator to narrow the linewidth of the semiconductor laser with respect to the cavity. In the final step, we discipline the cavity to the Rb atoms by slowly adjusting the intracavity power, which induces a thermo-optic frequency shift.

Figure 4D:
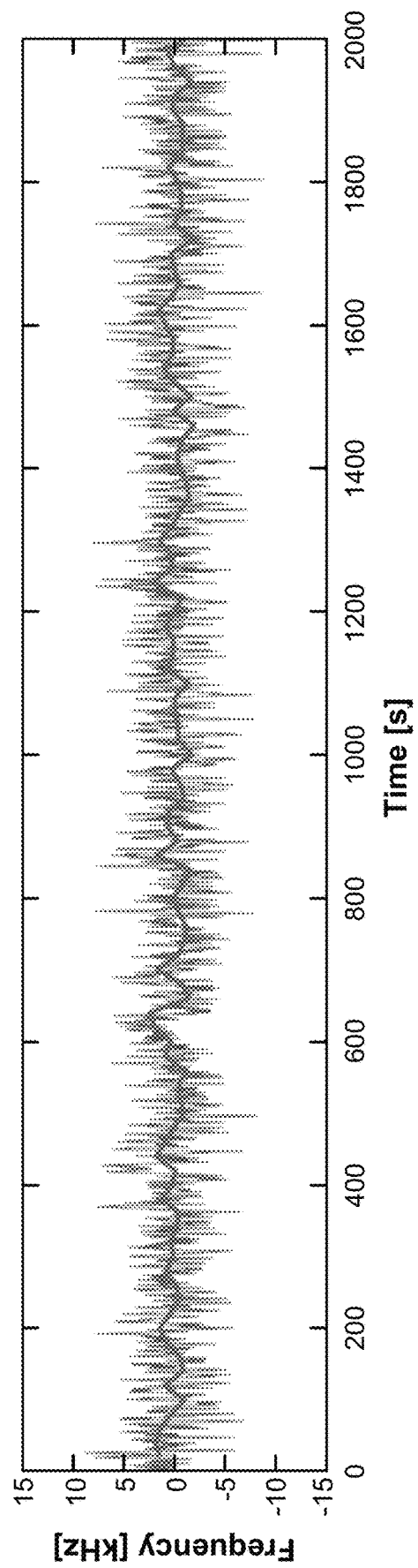
FIG. 4D shows the measured frequency of the photonic-atomic laser as a function of time.

With an operating photonic-atomic laser, we measure its optical lineshape (see FIG. 4C) and chart its output frequency (see FIG. 4D) over the course of 30 minutes. At any suitable instant in time during this measurement, the full-width half-maximum (FWHM) of the laser's optical lineshape is approximately 200 Hz (see FIG. 4C). The time-series measurement of the laser frequency indicates a 2.5 kHz standard deviation of fluctuations (see FIG. 4D) that can be attained in only 20 ms of averaging time. FIG. 4D also shows that the laser frequency is more stable by using 10 s averaging intervals, which filters out high-frequency noise. Calibration or complying with the International Bureau of Weights and Measures operational conditions for this atomic transition may provide improved accuracy. These results explain the short- and long-time stability of our system, offering narrow linewidth and kHz-level long-time frequency stability.

Experimental Methods

Figure 5:
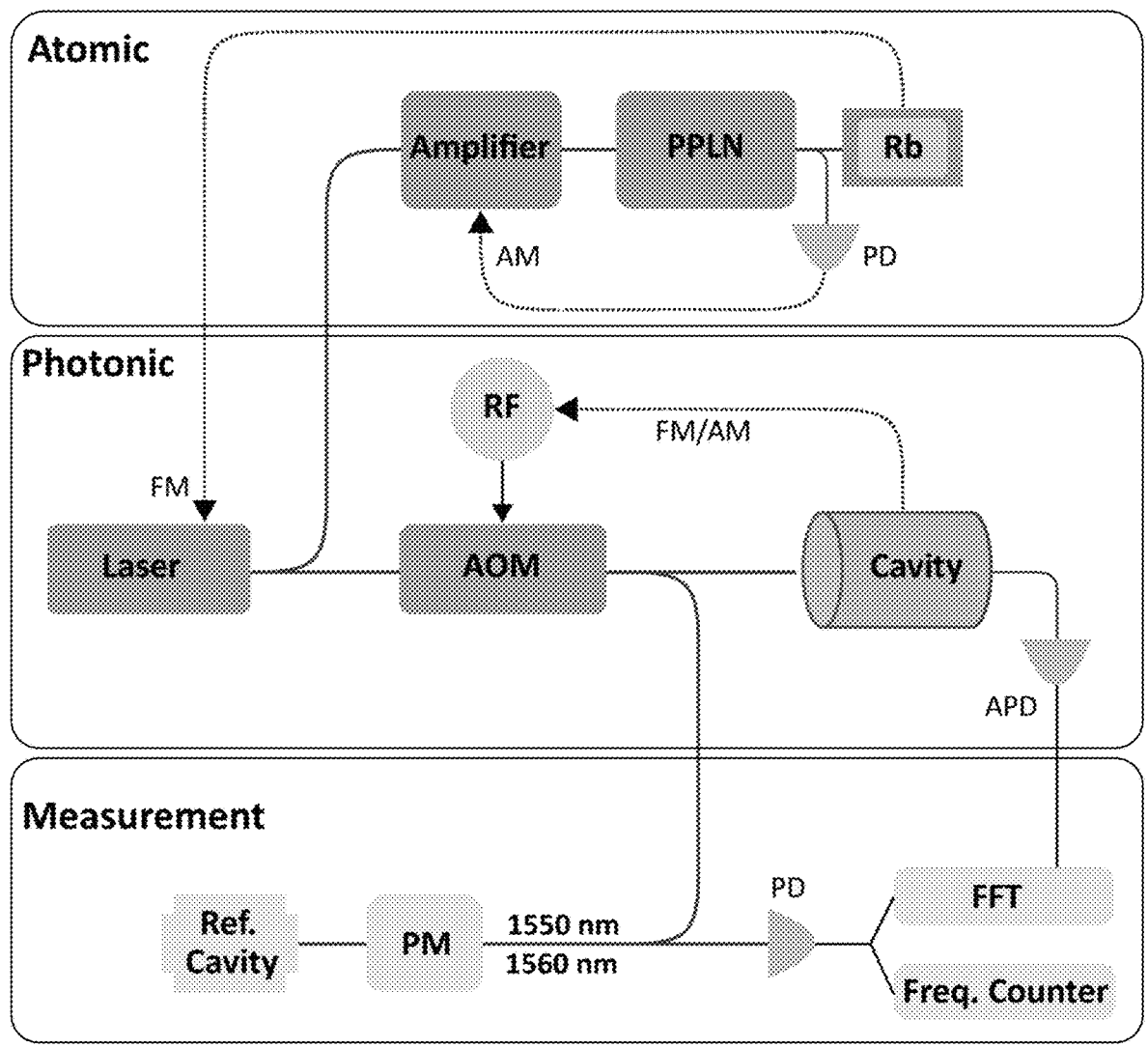
FIG. 5 shows the experimental scheme for operating the photonic-atomic laser. A portion of the continuous-wave (CW) laser is amplified, frequency-doubled by a periodically poled lithium niobate (PPLN) device, and stabilized to the Rb Doppler-free $D_2$ line using a current dither lock. An additional power stabilization servo is implemented using a photodetector (PD) and the current of the amplifier. The other part of CW laser is frequency-stabilized to the cavity by a Pound-Drever-Hall (PDH) lock in which an acousto-optic modulator (AOM) is the frequency actuator. By controlling the AOM RF driving power, the optical power injected to the cavity is controlled and via the thermo-optic effect modifies the cavity resonance frequency. The laser intensity noise is measured by an avalanche photodetector (APD). The laser frequency stability is characterized by optical heterodyne with a Hz-level reference laser. The beatnote is recorded by a fast Fourier transform (FFT) and a frequency counter.

FIG. 5A shows a schematic of the photonic-atomic laser and the measurement system used to characterize it. We measure the frequency stability of the cavity-stabilized laser by forming an optical heterodyne beat with a ~1-Hz-linewidth reference continuous-wave (CW) laser whose frequency drifts on average at ≈0.1 Hz/s. We record and analyze the heterodyne beatnote both in the frequency domain with an FFT analyzer to determine the power-spectral density of frequency noise and in the time-domain with a frequency counter to determine the Allan deviation.

In the atomic section, 1 mW of a CW laser at 1560 nm is amplified to 100 mW and then frequency-doubled to 780 nm by a periodically-poled lithium niobite (PPLN). The output power at 780 nm is ≈1 mW. By means of velocity selection in a counter propagating saturation spectroscopy scheme, we detect Doppler-free absorption lines with nearly lifetime-limited linewidth. We achieve such lineshapes by detecting a retroreflected beam that transverses a micro-machined mm-scale natural Rb vapor cell. The cell temperature is stabilized to approximately 60° C., using coaxial heaters to reduce magnetic fields. Measurements of the temperature stability of the cell reveal a temperature deviation of ±0.01° C. over the course of a few minutes as the transitions in this implementation have a temperature coefficient of 40 kHz/° C., such temperature stability implies a sub kHz stabilization limit. Light-shift-induced frequency shifts (measured to have a coefficient of ≈10 kHz/μW) are controlled in our system. 10% of the 780-nm light before the vapor cell is detected and used to stabilize 780-nm laser power by actuating the current of the amplifier with a 10 Hz bandwidth. To frequency-lock the laser to Doppler free transition, the current of the CW laser is dithered at 10 kHz with an instantaneous frequency excursion of 400 kHz. By demodulating the retroreflected signal be means of a lock-in-amplifier, we lock the laser to the atomic transition with a feedback bandwidth of ≈500 Hz.

In the photonic section, the CW laser at 1560 nm is frequency-locked to the reference cavity with the Pound-Drever-Hall (PDH) locking scheme. A fiber-packaged, waveguide electro-optic modulator (not shown in FIG. 5A) provides phase modulation at 20.5 MHz. An acousto-optic modulator (AOM) is the frequency actuator of which 10% power is used as output of the photonic-atomic system. The rest of the power of the AOM output, after an inline isolator, is collimated and free-space coupled to the cavity. In experiment, the input power for the cavity is ≈200 μW. The reflection of the cavity is received by an avalanche photodetector (APD, not shown in FIG. 5A) and demodulated to generate the PDH error signal by which the frequency modulation port of the radio frequency (RF) synthesizer for AOM is driven for frequency lock. The feedback bandwidth is 200 kHz, which is rapid enough to substantially reduce the free-running CW laser-frequency noise. The transmission of the cavity is received by an APD to measure the laser intensity noise.

We install the photonic cavity in a hermetic aluminum enclosure (7 cm×6 cm×6 cm) without active or passive vibration isolation. We design the cavity support structure (see support structure 200 in FIG. 2) to minimize vibration-induced frequency noise, since the relatively small volume of the cavity itself does not enable such an optimization. The support structure 200 is made of PTFE, and has the geometry shown in FIG. 2. As shown in the transparent view of FIG. 2, four support teeth directly contact the cavity. The overall vibration sensitivity of the cavity resonance frequency is optimized by adjusting d and θ. Guided by a finite element simulation, we chose d=4.3 mm and θ=55°. To measure the vibration sensitivity, the cavity with support structure is placed on an active isolation table driven by sinusoidal accelerations. An accelerometer calibrates the motion and the heterodyne beatnote is recorded for frequency response. With respect to earth's gravity g, we measure a vibration sensitivity of $1.7 \times 10^{-10}$/g along the gravitational direction and $1.4 \times 10^{-10}$/g in the horizontal plane, respectively. These sensitivities are consistent with our simulations and typically observed in optimized vacuum-gap Fabry-Perot cavities.

Another important consideration in our cavity support structure design is thermal isolation from room-temperature fluctuations, which induce drift in the cavity resonance frequency. We have not yet employed a multi-layer thermal isolator. Instead we utilize the low thermal conductivity of PTFE, and minimize the direct contact area, each tooth is 2 mm in width, between PTFE and the cavity. The cavity and its support form a thermal low-pass filter of which the measured time constant is 1100 s. As the temperature of the enclosure is actively controlled at the millikelvin level, the temperature-induced frequency fluctuation is expected to be ≈$1.5 \times 10^{-12}$ τ, where τ is the averaging time.

By measuring the cavity-stabilized laser with respect to the atomic transition, we reveal a slow frequency drift of the cavity. Consequently, the output of the cavity servo-loop with the drifting DC component is sent to another servo-loop integrator which drives the amplitude modulation port of the RF synthesizer. We modulate the incident power coupled to the cavity to actuate its resonance frequency through the thermo-optic effect with a coefficient off 200 kHz/μW at the wavelength of 1.5 μm. Thus, aligning the cavity resonance to the Rb atomic transition is achieved by an all-optical scheme.

Results and Discussion

Figure 6A:
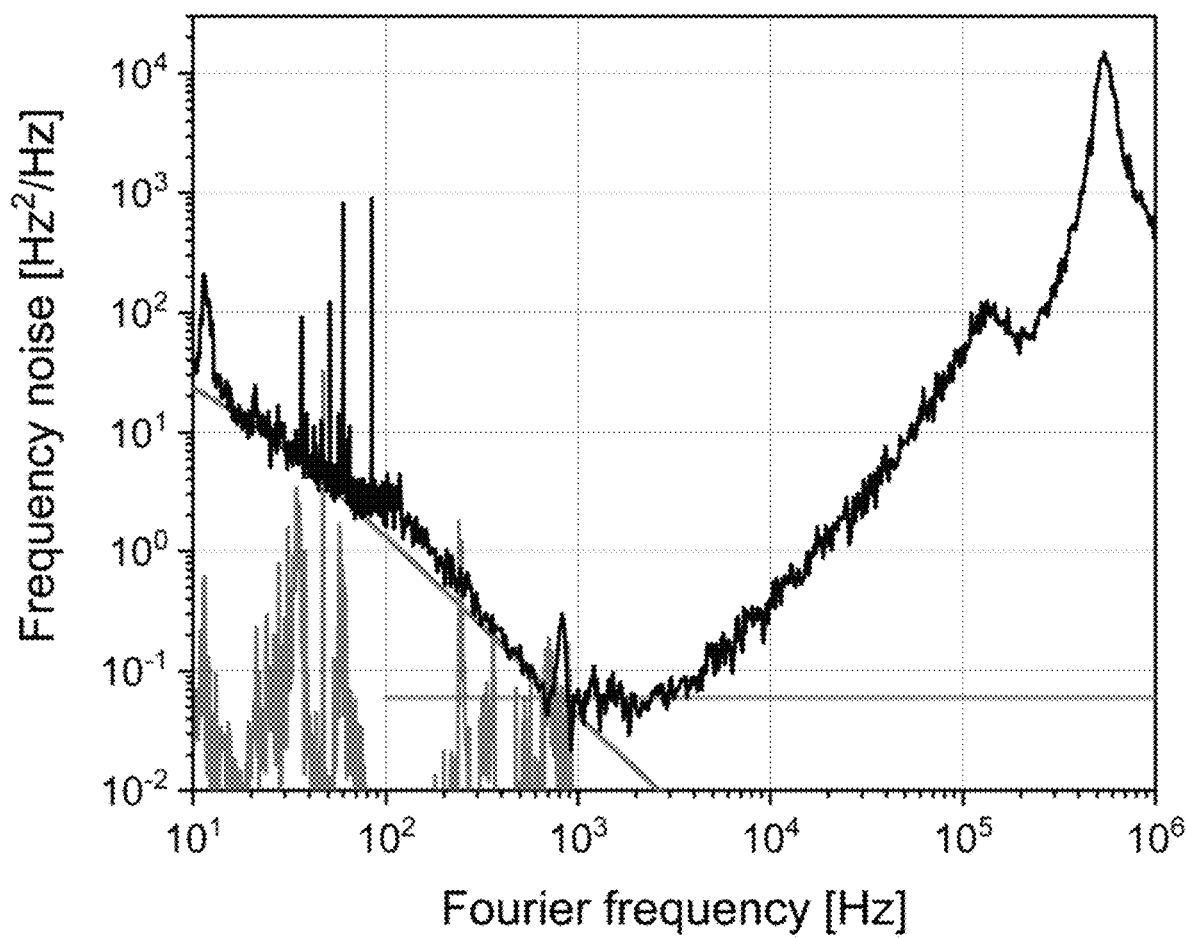
FIG. 6A shows, for the cavity-stabilized laser, the power-spectral density of laser frequency noise, the detection-noise floor of the photodetector in PDH locking, the inferred vibration-induced frequency noise, and the cavity thermorefractive-noise floor.
Figure 6B:
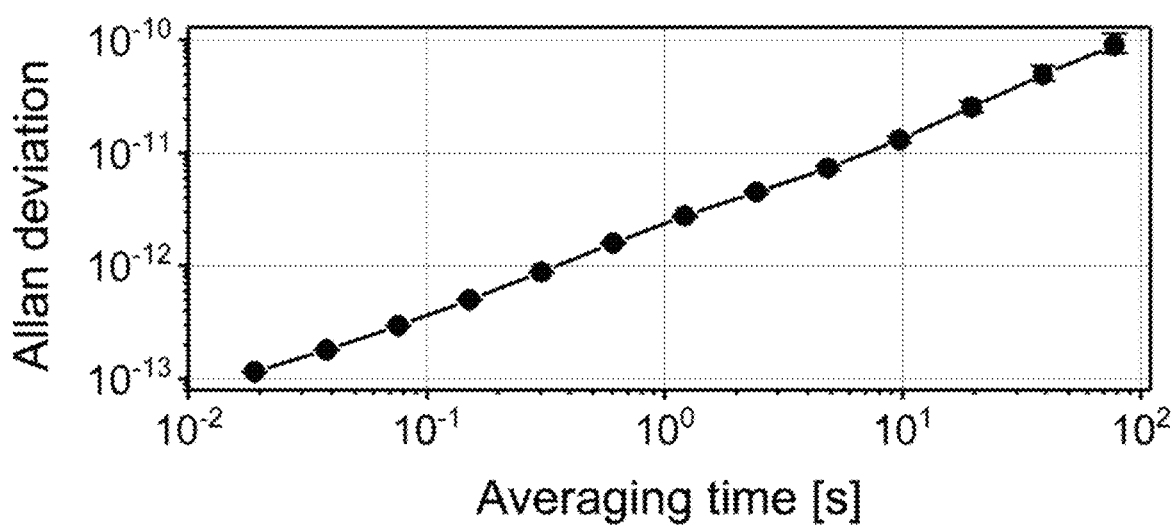
FIG. 6B shows the fractional-frequency stability of the cavity-stabilized laser, as measured in the time domain.

FIGS. 6A and 6B show characterization of the optical-frequency stability of the cavity-stabilized laser. FIG. 7 shows characterization of the optical-frequency stability of the photonic-atomic laser. To investigate the cavity, we disengage the phase modulation shown in FIG. 5A and frequency lock the CW laser to the cavity, using 10 μW of incident laser power. In FIG. 6A, the frequency-noise power spectral density of the cavity-stabilized laser (black line) is 30 $Hz^2$/Hz at 10 Hz Fourier frequency, corresponding to an improvement by $10^6$ compared to the free-running laser, and the Fourier-frequency dependence from 10 Hz to 1 kHz is consistent with what we predict for the cavity thermorefractive-noise spectrum. The detection noise of the photodetector in the PDH locking limits the frequency noise to 0.06 $Hz^2$/Hz from 1 kHz to 3 kHz, which corresponds to a Lorentzian linewidth of only 0.2 Hz. Beyond a Fourier frequency of 3 kHz, the frequency noise is dominated by the inloop error of the 600-kHz bandwidth PDH lock. Due to the optimization of the cavity-vibration sensitivity, our estimate of the vibration-induced frequency noise calculated by summing the vertical and horizontal directions in quadrature is well below the measured thermal-noise-limited frequency noise.

We determine the laser linewidth to be 25 Hz by integrating the phase noise from infinity to the Fourier frequency corresponding to 1 $rad^2$. Therefore the integrated linewidth is limited by fundamental thermal noise. Future experiments searching for higher performance may need to contend with this thermal-noise limit in innovative ways, since the optical mode volume of such cavities that primarily sets the thermal-noise linewidth cannot be substantially improved.

FIG. 6B shows the fractional frequency stability of the cavity-stabilized laser. We obtain the data for Allan deviation calculation by frequency counting the optical heterodyne beatnote with a dead-time free counter in so-called Λ mode. In these measurements, we have not applied any correction for the linear frequency drift that is relatively constant over time periods that extend beyond the maximum range of averaging times shown here. The cavity-stabilized laser stability reaches $1 \times 10^{-13}$ at τ=20 ms and follows ≈$1.5 \times 10^{-12}$ τ as predicted by the simulated temperature-induced frequency drift for τ>6 s.

The photonic cavity enables a narrow-linewidth laser, however temperature-induced frequency drift degrades the long-term frequency stability. Therefore, we stabilize the cavity resonance to a Rb transition which provides laser stability over periods of a few seconds and beyond. As mentioned earlier, this is achieved by controlling the power launched into the cavity, using an AOM. To achieve a stable and long-term lock, there are two aspects taken into account when choosing the laser power incident on the cavity. The first is the frequency drift rate of the cavity that varies from 100 Hz/s to 1000 Hz/s. We require sufficient control range through the incident power to maintain the photonic-atomic and cavity servo locks. Conversely, the laser-intensity-induced frequency noise is elevated due to the rising of the laser power. In our experiments, an overall compromise leads to an incident power of 200 μW.

Figure 7A:
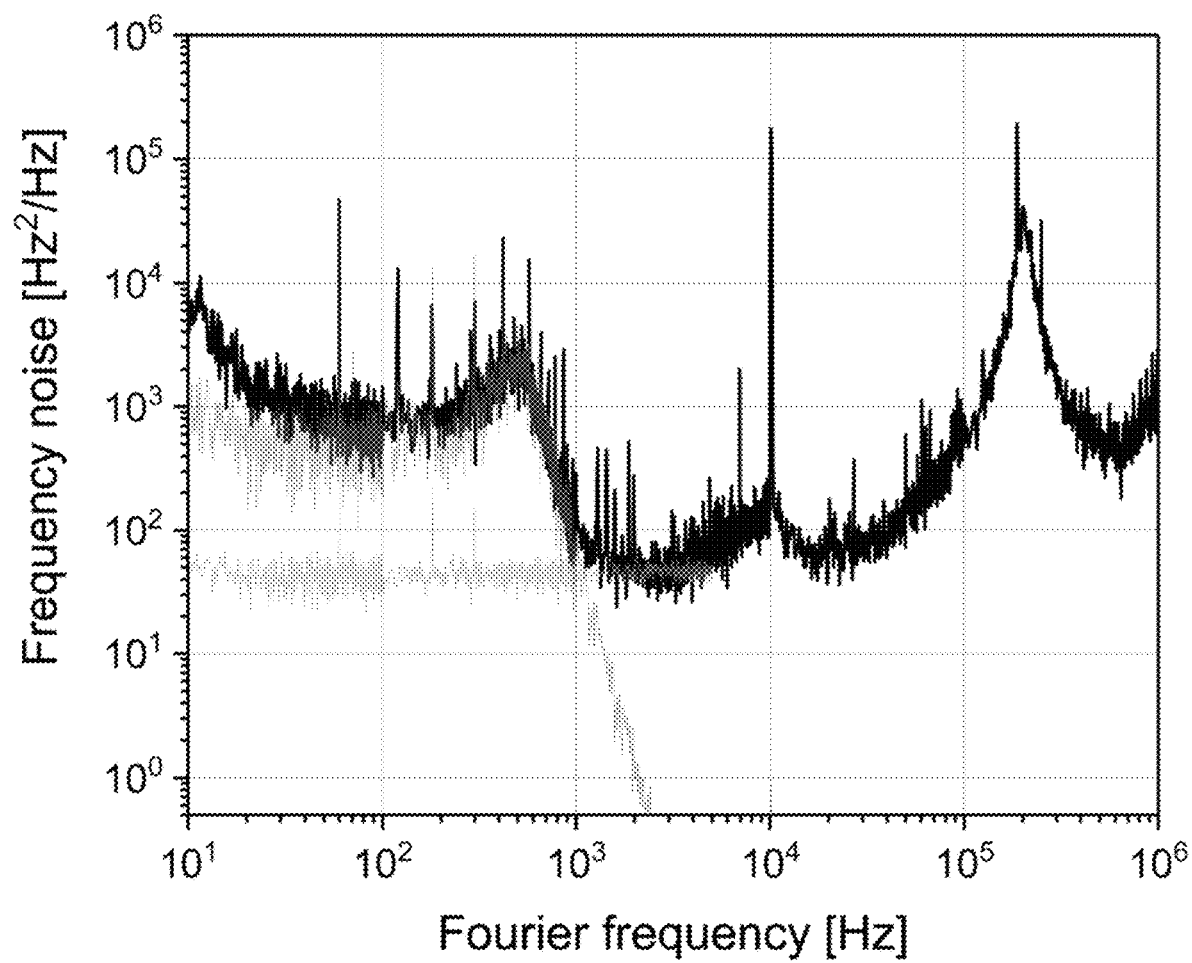
FIG. 7A shows the frequency noise, inloop error of the atomic servo, and laser-intensity induced noise measured for the photonic-atomic laser.
Figure 7B:
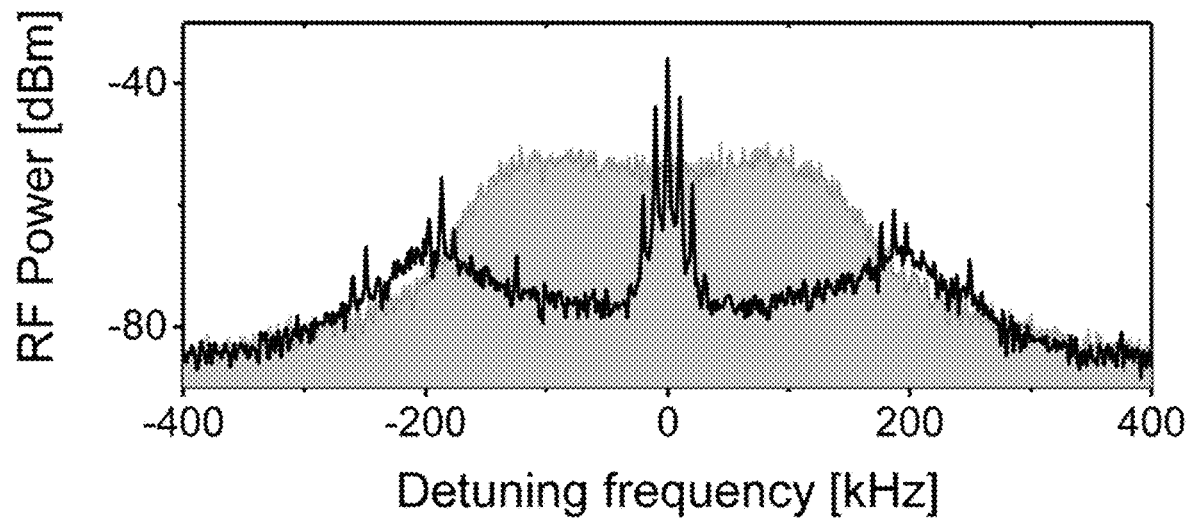
FIG. 7B shows the optical lineshape of the photonic-atomic laser with dither lock (gray shaded area) and anti-dither by AOM.
Figure 7C:
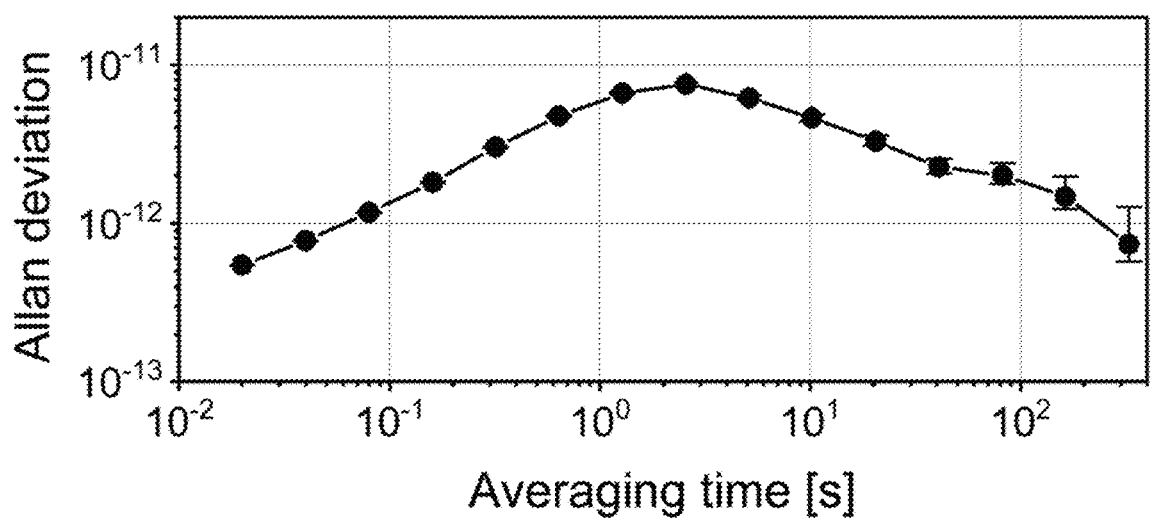
FIG. 7C shows the fractional frequency stability of the photonic-atomic laser, as measured in the time domain.

FIGS. 7A, 7B, and 7C show our characterization of the photonic-atomic laser, using the locking scheme described in the inset of FIG. 4B. In FIG. 7A, the frequency noise exhibits a dominant contribution for Fourier frequencies below 1 kHz. This is also evident by the inloop error of the servo stabilizing the laser to the Rb transition at 780 nm. Optimization of the modulation frequency, modulation depth and choice of detector may allow additional reduction of the frequency noise. These Fourier components increase the noise to 1000 $Hz^2/Hz$. As a result, the laser linewidth defined by integrating the phase noise up to 1 $rad^2$ is 990 Hz. Coupling a larger optical power level to the cavity sets the laser-intensity-induced frequency noise to a floor of 50 $Hz^2/Hz$ up to 5 kHz. We infer this contribution from measurements of laser-intensity noise in the cavity transmission and the thermo-optic coefficient. The latter is found to be 200 kHz/μW due to the absorption of the built-in laser power circulating within the cavity, which in turn induces heat and thermo-optically shifts the cavity resonance. Beyond a Fourier frequency of 5 kHz, the inloop error of the PDH servo-loop locking the photonic cavity dominates the frequency-noise spectrum, including the servo bump at 200 kHz.

FIG. 7B shows the optical lineshape of the photonic-atomic laser. The laser current dither that we apply for stabilization to a Rb transition at 780 nm broadens the spectral width to as much as 400 kHz (see the shaded area of FIG. 7B). By implementing the cavity lock at the same time as the atom lock, the laser linewidth is narrowed substantially to 200 Hz. The residual peaks correspond to the 10-kHz dither signal.

FIG. 7C shows the fractional frequency stability that our photonic-atomic laser achieves. This Allan deviation provides the clearest summary of our hybrid laser system, capturing the crossover between passive stability of the cavity and intrinsic stability of the atomic transition. In comparison to our results without atomic stabilization (see FIG. 6B), the stability is degraded for 20 ms<τ<1 s. However, for τ>1 s, the stability is well below $10^{-11}$ with a slope of $\tau^{-1/2}$ showing the impact of the atomic lock. For example, the frequency stability at τ=100 s is improved by two orders of magnitude compared to the result shown in FIG. 6B.

CONCLUSION

We have demonstrated a compact photonic-atomic laser featuring high spectral purity and long-term frequency stability traceable to Rb atoms. The miniaturized components are relatively cost-effective, robust, and offer a passive vibration immune design as low as $10^{-10}$/g. The cavity supports short-term stability reaching $1 \times 10^{-13}$ at τ=20 ms, leading to a 25-Hz integrated linewidth. Interfacing such a cavity with atoms, our system mostly preserves the short-time stability of the cavity and shows a stability of $7 \times 10^{-13}$ at τ=300 s, and an instantaneous linewidth of 200 Hz.

Our results indicate a path for achieving even better performance. It is noteworthy that the finesse of the monolithic Fabry-Perot cavity is now limited by the material optical loss, which we measure to be 130 ppm. Since fused silica with optical losses <10 ppm should be available, it is conceivable to substantially increase the cavity Q to above 10 billion. Cavity frequency drift associated with ambient temperature fluctuations may also be further suppressed by a more aggressive thermal low-pass filter. Moreover, the atomic-Rb system could also be operated at higher performance and with absolute frequency calibration with control of systematic effects. Indeed, fractional stability as low as $4 \times 10^{-13} \tau^{-1/2}$ have been reported, using a two-photon Rb transition at 778 nm with a cm-scale cell. Recently, such transitions have been demonstrated in micromachined cells supporting stabilities as low as $4 \times 10^{-12} \tau^{-1/2}$. Thus, optimizing the cavity and the implemented atomic line, provides a path to a thermal-noise-limited, low drift, and accurate laser with Hz-level integral linewidth.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A monolithic photonic resonator comprising:
   a bulk optic with (i) one or more additional facets off of which light inside the bulk optic undergoes total internal reflection, (ii) a first and a second superpolished facet; and
   a high-reflectivity coating applied to each of the first and the second superpolished facets;
   wherein the first and second superpolished facets (i) form an optical resonator and (ii) cooperate with the one or more additional facets to define a mode structure of the optical resonator.

2. The monolithic photonic resonator of claim 1, wherein the first and second superpolished facets are counterfacing such that the optical resonator is a Fabry-Perot cavity.

3. The monolithic photonic resonator of claim 2, wherein:
   the bulk optic is shaped as a solid cylinder; and
   each of the first and second superpolished facets forms a circular end face of the solid cylinder.

4. The monolithic photonic resonator of claim 2, wherein a distance between the first and second superpolished facets is between 5 and 100 mm.

5. The monolithic photonic resonator of claim 1, wherein each of the first and second superpolished facets is planar.

6. The monolithic photonic resonator of claim 1, wherein one or both the first and second superpolished facets is convex.

7. The monolithic photonic resonator of claim 1, wherein the bulk optic is fabricated from one of: fused silica, sapphire, silicon, calcium fluoride, magnesium fluoride, terbium-doped calcium fluoride, terbium-doped fused silica, glass, and quartz.

8. The monolithic photonic resonator of claim 1, wherein each high-reflectivity coating comprises an ion-beam sputtered dielectric stack.

9. The monolithic photonic resonator of claim 1, wherein the first and second superpolished facets are co-planar.

10. The monolithic photonic resonator of claim 1, at least one of the one or more additional facets being angled with respect to one or both of the first and second superpolished facets such that the optical resonator has a three-dimensional longitudinal mode structure.

11. The monolithic photonic resonator of claim 1, each of the one or more additional facets being angled with respect to one or both of the first and second superpolished facets such that the optical resonator has a two-dimensional longitudinal mode structure.

12. A monolithic photonic resonator comprising:
    a bulk optic with a first and a second superpolished facet; and
    a high-reflectivity coating applied to each of the first and the second superpolished facets;
    wherein the first and second superpolished facets form an optical resonator having a finesse of 10,000 or more at a wavelength between 1500 and 1600 nm.

13. A method for laser frequency stabilization, comprising:
    coupling laser light into the monolithic photonic resonator of claim 12;
    detecting light from the monolithic photonic resonator; and
    locking, based on the detected light, a frequency of the laser light to a resonance of the monolithic photonic resonator.

14. A monolithic photonic resonator comprising:
    a bulk optic with a first and a second superpolished facet that form an optical resonator;
    a high-reflectivity coating applied to each of the first and the second superpolished facets; and
    a support structure configured to receive the bulk optic, the support structure containing one or more support teeth that physically secure the bulk optic to the support structure.

15. The monolithic photonic resonator of claim 14, wherein:
    the bulk optic is shaped as a solid cylinder with a longitudinal optical axis;
    the support structure is configured with a through-hole sized to receive the bulk optic; and
    each of the one or more support teeth subtends an angle with respect to the longitudinal optical axis.

16. A method for laser frequency stabilization, comprising:
    coupling laser light into the monolithic photonic resonator of claim 14;
    detecting light from the monolithic photonic resonator; and
    locking, based on the detected light, a frequency of the laser light to a resonance of the monolithic photonic resonator.

* * * * *